US012660278B2

(12) United States Patent  
Le et al.

(10) Patent No.: US 12,660,278 B2  
(45) Date of Patent: Jun. 16, 2026

(54) TRANSISTOR, ELECTRONIC COMPONENT, AND TERMINAL DEVICE

(71) Applicant: HUAWEI TECHNOLOGIES CO., LTD., Shenzhen (CN)

(72) Inventors: Lingcong Le, Shenzhen (CN); Shujun Dai, Suzhou (CN); Xiaogang Li, Suzhou (CN); Huilan Hu, Suzhou (CN); Hao Jiang, Shenzhen (CN); Chang Zeng, Suzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 370 days.

(21) Appl. No.: 18/361,009

(22) Filed: Jul. 28, 2023

(65) Prior Publication Data

US 2023/0369422 A1 Nov. 16, 2023

Related U.S. Application Data

(63) Continuation of application No. PCT/CN2021/074384, filed on Jan. 29, 2021.

(51) Int. Cl.  
*H10D 64/00* (2025.01)  
*H10D 30/47* (2025.01)  
(Continued)

(52) U.S. Cl.  
CPC ......... *H10D 64/112* (2025.01); *H10D 30/475* (2025.01); *H10D 62/8503* (2025.01); *H10D 64/411* (2025.01)

(58) Field of Classification Search  
CPC .. H10D 64/112; H10D 64/111; H10D 64/411; H10D 64/01; H10D 64/117;  
(Continued)

(56) References Cited

U.S. PATENT DOCUMENTS 9,093,420 B2 * 7/2015 Kobayashi ........... H10D 64/411  
10,930,745 B1 * 2/2021 Lin ...................... H10D 64/258  
(Continued)

FOREIGN PATENT DOCUMENTS

CN 104637991 A * 5/2015 ............. H01L 29/06  
CN 106486363 A 3/2017  
(Continued)

OTHER PUBLICATIONS

Gao et al., An Improved Site Plate Structure Gallium Nitride High Electron Migration Rate Transistor, 2015, machine translation of CN 104637991, pp. 1-10. (Year: 2015).*

*Primary Examiner* — Natalia A Gondarenko  
(74) *Attorney, Agent, or Firm* — Rimon PC

(57) ABSTRACT

This application provides a transistor, including a channel, a source, a drain, a gate, an isolation area disposed on two sides of the channel, and a source field plate located on a side of the gate away from the channel. The source field plate is electrically connected to the source. The source field plate includes a primary field plate and a secondary field plate. The primary field plate partially overlaps the gate. A side part of the primary field plate crosses the gate and extends to the drain along the channel. A first end of the primary field plate crosses the channel along a direction perpendicular to the channel and enters the isolation area. The secondary field plate is located at a boundary between the channel and the isolation area, and extends from the primary field plate to a direction of the source along the channel.

20 Claims, 5 Drawing Sheets

(51) Int. Cl.
 *H10D 62/85* (2025.01)
 *H10D 64/27* (2025.01)

(58) Field of Classification Search
 CPC ...... H10D 64/20; H10D 64/23; H10D 64/251;
 H10D 64/254; H10D 64/257; H10D
 64/258; H10D 64/27; H10D 64/311;
 H10D 64/513; H10D 64/518; H10D
 30/015; H10D 30/021; H10D 30/40;
 H10D 30/475; H10D 30/47–476; H10D
 62/8503; H10D 62/852; H10D 62/213;
 H10D 62/221; H10D 62/10; H10D
 62/126; H10D 62/343; H01L 29/0696;
 H01L 29/122; H01L 29/125; H01L
 29/127; H01L 29/15; H01L 29/158; H01L
 29/2003; H01L 29/205; H01L 29/404;
 H01L 29/42356; H01L 29/66431; H01L
 29/66462; H01L 29/41766; H01L
 29/41775; H01L 29/42316; H01L
 29/4916; H01L 29/778; H01L 29/7789;
 H01L 29/7786; H01L 29/7787; H01L
 29/7839; H01L 29/806; H01L 29/812

USPC ..................................... 257/194, 196, 76, 77
See application file for complete search history.

(56) References Cited

U.S. PATENT DOCUMENTS

| | | | | |
|---|---|---|---|---|
| 2006/0118809 | A1* | 6/2006 | Parikh | .................. H10D 64/111 |
| | | | | 257/E29.127 |
| 2011/0291203 | A1 | 12/2011 | Miyao | |
| 2015/0295053 | A1 | 10/2015 | Kobayashi et al. | |
| 2016/0035870 | A1 | 2/2016 | Wu et al. | |
| 2016/0079403 | A1 | 3/2016 | Yamamura | |
| 2016/0260615 | A1 | 9/2016 | Hirai et al. | |
| 2019/0123152 | A1* | 4/2019 | Yamada | ............. H10D 62/8503 |
| 2021/0043724 | A1* | 2/2021 | Wu | ........................ H10D 64/01 |

FOREIGN PATENT DOCUMENTS

| | | | |
|---|---|---|---|
| CN | 109585543 | A | 4/2019 |
| CN | 109904226 | A | 6/2019 |
| CN | 111627988 | A | 9/2020 |
| CN | 112038402 | A | 12/2020 |
| CN | 112103337 | A | 12/2020 |
| JP | 2020113625 | A | 7/2020 |

* cited by examiner a-a' b-b'

TRANSISTOR, ELECTRONIC COMPONENT, AND TERMINAL DEVICE

CROSS-REFERENCE TO RELATED APPLICATIONS

This application is a continuation of International Application No. PCT/CN2021/074384, filed on Jan. 29, 2021, the disclosure of which is hereby incorporated by reference in its entirety.

TECHNICAL FIELD

This application relates to the field of semiconductor technologies, and in particular, to a transistor, an electronic component, and a terminal device.

BACKGROUND

Due to the excellent characteristics of the third-generation semiconductor GaN material, such as a large band gap width, a high breakdown electric field, a large saturation rate, and a density of two-dimensional electron gas (2DEG) at an AlGaN/GaN heterojunction interface caused by a polarization effect, a GaN HEMT (high-electron-mobility transistor) component can work at a high voltage and at a high temperature/frequency. Therefore, it has gained great attention in the industry.

However, in GaN HEMT components, electrostatic discharge (ESD) usually occurs easily in a weak area (an area in which the electric field strength is concentrated). In particular, at boundaries such as those between an isolation area and an active area of the GaN HEMT component, isolation damage easily occurs. As a result, the capacity of the component to withstand ESD damage (ESD capability hereafter) is weakened and ESD breakdown easily occurs.

SUMMARY

Embodiments of this application provide a transistor, an electronic component, and a terminal device, to improve an ESD capability of the transistor.

The transistor provided in embodiments of this application includes a channel, a source, a drain, a gate, an isolation area disposed on two sides of the channel, and a source field plate located on a side of the gate away from the channel. The source field plate is electrically connected to the source. The source field plate includes a primary field plate and a secondary field plate.

The primary field plate partially overlaps the gate. A side part of the primary field plate crosses the gate and extends to the drain along a channel. A first end of the primary field plate crosses the channel along a direction perpendicular to the channel and enters an isolation area. When the transistor is in a reverse bias state (to be specific, a negative voltage is applied to the gate, and a high positive voltage is applied to the drain), based on introduction of the primary field plate, an exhaustion area of the primary field plate close to a side of the drain may be extended to an area close to a lower part of the primary field plate, and further, the electric field strength of the gate is dispersed, thereby reducing feedback capacitance (Cgd), improving a gain characteristic of the component, and increasing a breakdown voltage of the component to suppress current collapse.

The foregoing secondary field plate is located at a boundary between the channel and the isolation area, and extends from the primary field plate to a direction of the source along the channel. Based on the introduction of the secondary field plate, when a large amount of electrostatic charge is accumulated at the gate, the electric field strength of the gate can be dispersed at the boundary between the isolation area and the channel by using the primary field plate and the secondary field plate, and an electric field peak generated by the gate can be reduced, thereby reducing the probability of an ESD breakdown occurring at a position between the gate and the two-dimensional electron gas in the channel in a boundary area between the channel and the isolation area, thereby improving the ESD capability of the transistor.

In some possible implementations, the transistor includes a buffer layer and a barrier layer that are disposed in a stacked manner, and the channel is located at a boundary between the buffer layer and the barrier layer. In this case, the two-dimensional electron gas (2DEG) that forms the channel can be generated at the boundary (namely, a heterojunction interface) between the buffer layer and the barrier layer.

In some possible implementations, the secondary field plate extends from the primary field plate to an area between the gate and the source along the channel.

In some possible implementations, the secondary field plate extends from the primary field plate along the channel to connect to the source. In this case, in the transistor, an extension part may not be separately disposed to connect the source field plate and the source.

In some possible implementations, the source field plate includes two secondary field plates, and the two secondary field plates respectively extend from the side surfaces of two end parts of the primary field plate to a side of the source. In this case, the electric field strength of the gate in the boundary area between the channel and the isolation areas on the two sides can be further dispersed by using the two secondary field plates, and the electric field peak generated by the gate in the boundary area between the channel and the isolation areas on the two sides can be reduced, thereby further reducing the probability of ESD breakdown occurring between the gate and the two-dimensional electron gas in the channel of the transistor, thereby improving the ESD capability of the component.

In some possible implementations, an included angle between a part of the secondary field plate located in the channel and the primary field plate is greater than 90°, preventing an electric field peak from being generated because a sharp included angle shape is formed at a joint between the secondary field plate and the primary field plate located in an active area.

In some possible implementations, a distance that the secondary field plate extends from the boundary between the channel and the isolation area to a side of the channel is 1% to 5% of a width of the channel, and a distance that the secondary field plate extends to a side of the isolation area is 1% to 5% of the width of the channel, to ensure that an electric field peak generated on a side of the gate close to the source can be effectively reduced by using the secondary field plate, and ensure that an excessively large parasitic capacitance is not introduced between the source field plate and the gate, so that the performance of the component is not affected.

In some possible implementations, the primary field plate and the secondary field plate are an integrated structure of a same layer and a same material. To be specific, the primary field plate and the secondary field plate can be obtained through patterning a same film layer (for example, including processes such as exposure, development, evaporation, and stripping), so that a manufacturing process can be simplified, and manufacturing costs can be reduced.

In some possible implementations, a T-type gate structure is used for the gate. A gate field plate is disposed to extend the gate to the side of the source and the side of the drain respectively, so that electric field distribution under the gate can be modulated, a peak electric field can be reduced, and a breakdown voltage of the component can be increased.

An embodiment of this application further provides an electronic component, including the transistor provided in any one of the foregoing possible implementations.

An embodiment of this application further provides a terminal device, including the transistor provided in any one of the foregoing possible implementations.

DESCRIPTION OF EMBODIMENTS

To make the objectives, technical solutions, and advantages of this application clearer, the following clearly describes the technical solutions in this application with reference to the accompanying drawings in this application. It is clear that the described embodiments are some but not all embodiments of this application. All other embodiments obtained by a person of ordinary skill in the art based on embodiments of this application without creative efforts shall fall within the protection scope of this application.

In this specification, embodiments, claims, and accompanying drawings of this application, terms "first", "second", and the like are merely intended for distinguishing and description, and shall not be understood as an indication or implication of relative importance or an indication or implication of an order. Similar terms "connection", "connected", and the like are used to express intercommunication or interaction between different components, and may include a direct connection or an indirect connection through another component. In addition, terms "include", "have", and any variant thereof are intended to cover non-exclusive inclusion, for example, include a series of steps or units. Methods, systems, products, or devices are not necessarily limited to those steps or units that are literally listed, but may include other steps or units that are not literally listed or that are inherent to such processes, methods, products, or devices. "On", "below", "left", "right", and the like are used only relative to the orientation of the components in the accompanying drawings. These directional terms are relative concepts, are used for relative descriptions and clarifications, and may change accordingly as positions at which the components in the accompanying drawings are placed change.

An embodiment of this application provides a terminal device. The terminal device may be an electronic product such as a mobile phone, a tablet computer, a notebook computer, a vehicle-mounted computer, a smartwatch, or a smart band. A specific form of the terminal device is not specially limited in this embodiment of this application.

An electronic component, such as a power component or a radio frequency component, is disposed in the foregoing terminal device. This is not limited in this application. A high-electron-mobility transistor (HEMT) that uses a gallium nitride (GaN) material, namely, a GaN HEMT, is disposed in the electronic component.

When the GaN HEMT provided in this embodiment of this application is used, ESD performance of the electronic component can be improved, and the reliability of the terminal device can be improved.

The following further describes the GaN HEMT provided in this embodiment of this application.

Figure 1:
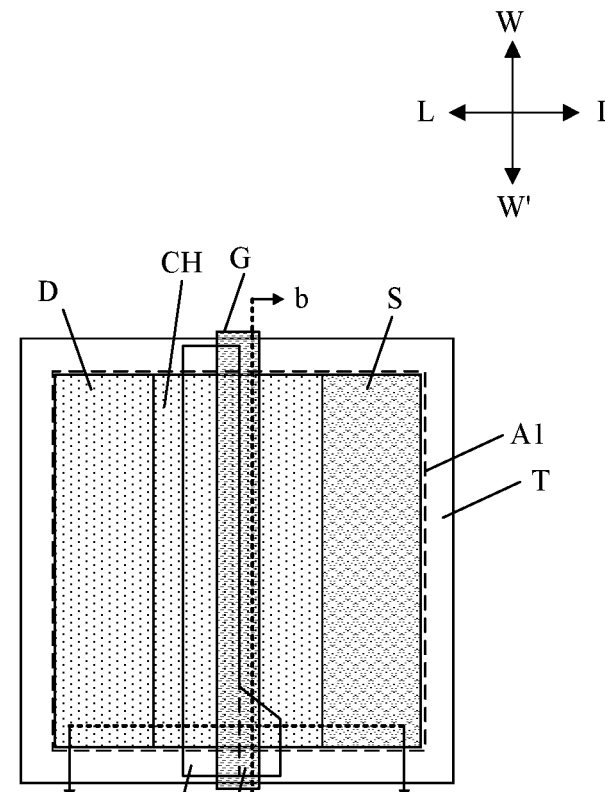
FIG. 1 is a schematic diagram of a structure of a transistor according to an embodiment of this application.

Refer to FIG. 1. First, for the foregoing GaN HEMT (which may be referred to as a transistor for short below), the transistor includes an active area A1 and an isolation area T (which may also be referred to as a doping isolation area or an implantation isolation area) located around the active area A1. In other words, an area enclosed by the isolation area T is the active area A1. In this way, the active area A1 is isolated by using the isolation area T, ensuring normal operation of the active area of the transistor. The following separately describes in detail setting the active area A1 and the isolation area T.

Figure 2:
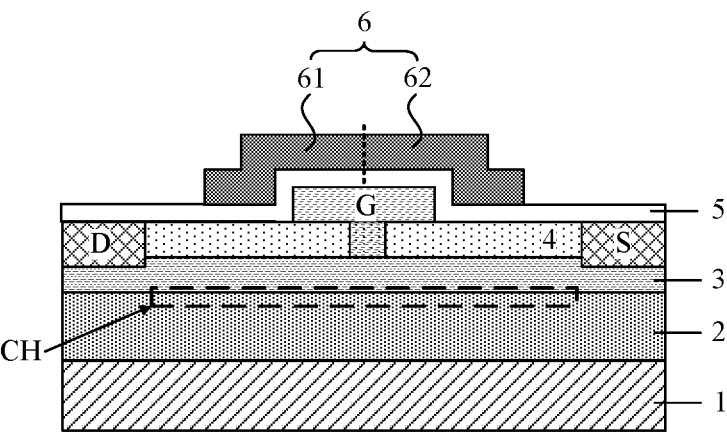
FIG. 2 is a schematic diagram of a cross section of FIG. 1 along a position aa'.

For the foregoing active area A1, for example, refer to FIG. 1 and FIG. 2 (which is a schematic diagram of a cross section of FIG. 1 along a position aa'). The transistor in the active area A1 may include: a buffer layer 2, a barrier layer 3, a passivation layer 4 that are sequentially disposed on a substrate 1 in a stacked manner. A source S, a drain D, and a gate G are separately in contact with the barrier layer 3 through a hollow zone in the passivation layer 4.

In addition, refer to FIG. 2. In the transistor, a two-dimensional electron gas (2DEG) can be generated at a boundary (namely, a heterojunction interface) between the buffer layer 2 and the barrier layer 3, to form a channel CH.

A person skilled in the art may understand that the channel CH is located in an area between the source S and the drain D. A length direction LL' of the channel (which may also be referred to as a channel direction) is a direction between the source S and the drain D, and a width direction WW' of the channel is perpendicular to the length direction LL' of the channel.

As shown in FIG. 2, in some possible implementations, a T-type gate structure may be used for the foregoing gate G, to introduce a gate field plate (GFP). To be specific, parts respectively extending to a side of the source and a side of the drain are disposed on a top of the gate G. It may be understood that the gate field plate (GFP) is disposed to extend the gate G to the side of the source and the side of the drain respectively, so that the electric field distribution under the gate G can be modulated, a peak electric field can be reduced, and a breakdown voltage of the component can be increased. The following embodiments are all described by using an example in which the T-type gate structure is used for the gate G (in other words, the gate field plate is introduced).

For the foregoing isolation area T:

It may be understood that the isolation area T is disposed to isolate the active area A1, and in particular, to isolate the two-dimensional electron gas (2DEG) generated in the channel CH, to ensure that a single transistor works independently and normally.

Figure 3:
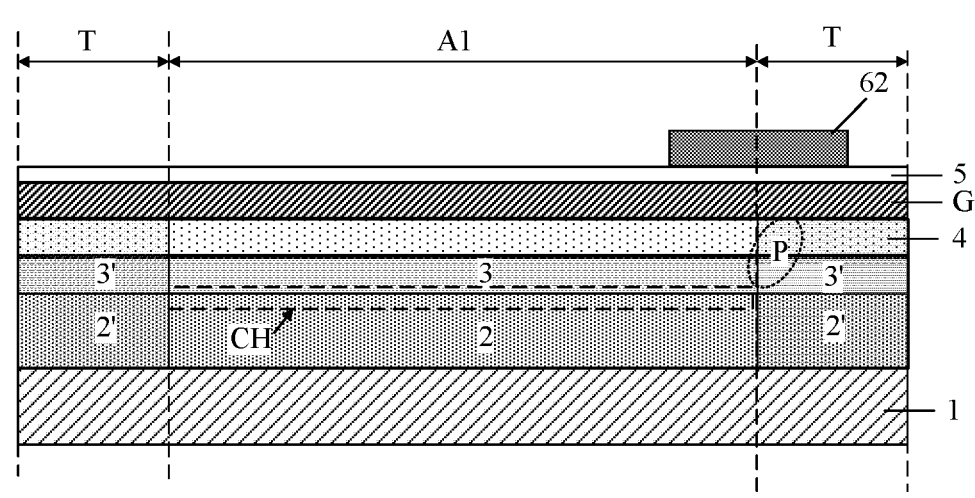
FIG. 3 is a schematic diagram of a cross section of FIG. 1 along a position bb'.

For example, refer to FIG. 1 and FIG. 3 (which is a schematic diagram of a cross section of FIG. 1 along a position bb'). The buffer layer 2 and the barrier layer 3 are located in the active area A1 and extend into the isolation area T, and the parts may be referred to as extended parts (namely, 2' and 3') of the buffer layer 2 and the barrier layer 3. The isolation area T is usually obtained by using the extended parts (2' and 3') of the buffer layer and the barrier layer as a body through ion implantation (for example, N ions may be used for implantation). For example, refer to FIG. 3. The N ions may be implanted in the isolation area T from a top to a bottom of the extended part 3' of the barrier layer, to implant the N ions in the extended parts (2' and 3') of the buffer layer and the barrier layer, to form the isolation area T.

Refer to FIG. 1 and FIG. 3. It may be understood that, in a process of forming the isolation area T through ion implantation, a high-dose high-energy ion beam flow inevitably causes damage to the crystal structure in the extended parts (2' and 3') of the buffer layer and the barrier layer in the isolation area T, and causes material damage. As a result, the quality of the extended parts (2' and 3') of the buffer layer and the barrier layer in the isolation area T decreases. In this case, when a large amount of electrostatic charge is accumulated on the gate G, a large electric field is generated at the gate field plate close to the side of the source, and consequently, in a boundary area between the isolation area T and the channel CH, ESD breakdown easily occurs at a position (for example, a position P in FIG. 3) between the gate G and the two-dimensional electron gas (2DEG) in the channel CH.

Refer to FIG. 1 and FIG. 2. To resolve the foregoing technical problem, the transistor in this embodiment of this application further includes a source field plate 6 (SPF). The source field plate 6 is disposed on a side of the gate G away from the channel CH. In other words, the source field plate 6 is formed above the gate G, and the source field plate 6 is electrically connected to the source S (for an electrical connection between the source field plate 6 and the source S, refer to the following related descriptions). The source field plate 6 at least partially overlaps the gate G. In other words, a projection of the source field plate 6 on the substrate 1 partially overlaps a projection of the gate G on the substrate 1. The source field plate 6 is not in direct contact with the gate G, and a passivation layer 5 is formed between the source field plate 6 and the gate G and is configured to isolate the source field plate 6 from the gate G. The following specifically describes a structure of the source field plate 6 in this application.

Refer to FIG. 1 and FIG. 2. The foregoing source field plate 6 may include a primary field plate 61 and a secondary field plate 62. The following describes specifications of the primary field plate 61 and the secondary field plate 62 separately.

Refer to FIG. 1. The primary field plate 61 partially overlaps the gate G. A side part of the primary field plate 61 close to the drain D crosses (or crosses over) the gate G, extends to the drain D along the channel direction (namely, the LL' direction) (where certainly, the side part is not in contact with the drain D). In addition, in a direction (namely, the WW' direction) perpendicular to the channel direction, two ends of the primary field plate 61 extend to the isolation area T on both sides of the channel CH.

In this case, for the transistor, in a reverse bias state (to be specific, a negative voltage is applied to the gate, and a high positive voltage is applied to the drain), based on the introduction of the primary field plate 61, an exhaustion area of the gate close to a side of the drain may be extended to an area close to a lower part of the primary field plate 61, and further, the electric field strength of the gate is dispersed, thereby reducing feedback capacitance (Cgd), improving a gain characteristic of the component, and increasing a breakdown voltage of the component to suppress current collapse. In addition, because the exhaustion area below the primary field plate 61 is not affected by modulation of an input signal, linearity of the component can be improved.

Refer to FIG. 1 and FIG. 3. The foregoing secondary field plate 62 is located at the boundary between the isolation area T and the channel CH, and the secondary field plate 62 extends from the primary field plate 61 to the side of the source S along the channel direction (namely, the LL' direction). In other words, in the boundary area between the channel CH and the isolation area T that are in the transistor, the source field plate 6 extends, to the source S, the secondary field plate 62 from a side part of the primary field plate 61 close to the source S.

In this case, for the transistor, when a large amount of electrostatic charge is accumulated on the gate G and the large electric field is generated at the gate field plate close to the side of the source, the exhaustion area of the gate G close to the side of the source S can be extended to an area close to a lower part of the secondary field plate 62. Through the secondary field plate 62, the electric field strength of the gate G at the boundary between the channel CH and the isolation area T can be further dispersed, and an electric field peak generated by the gate G can be reduced, so that a probability of ESD breakdown occurring between a side of the gate G close to the source and the two-dimensional electron gas (2DEG) in the channel CH in the boundary area between the isolation area T and the channel CH can be reduced.

In conclusion, according to the transistor provided in this embodiment of this application, the primary field plate 61 and the secondary field plate 62 that are connected are disposed at the boundary between the isolation area T and the channel CH, and the primary field plate 61 and the secondary field plate 62 cross two edges (one edge close to the side of the drain and one edge close to the side of the source) of both sides of the gate G along the channel direction, that is, the primary field plate 61 and the secondary field plate 62 cross the entire gate G. In this case, based on the introduction of the primary field plate, the exhaustion area of the gate close to the side of the drain may be extended to the area close to the lower part of the primary field plate, and further, the electric field strength of the gate is dispersed, thereby reducing the feedback capacitance (Cgd), improving the gain characteristic of the component, and increasing the breakdown voltage of the component to suppress current collapse. In addition, based on the introduction of the secondary field plate 62, when the large amount of electrostatic charge is accumulated on the gate G, the electric field strength of the gate G can be dispersed at the boundary between the channel CH and the isolation area T by using the primary field plate 61 and the secondary field plate 62, and the electric field peak generated by the gate G can be reduced, thereby reducing the probability of ESD breakdown occurring between the gate G and the two-dimensional electron gas (2DEG) in the channel CH in the boundary area between the isolation area T and the channel CH, thereby improving an ESD capability of the transistor.

In this application, a connection manner between the source field plate 6 and the source S is not specifically limited. In practice, an appropriate connection method may be selected based on a requirement.

Figure 4:
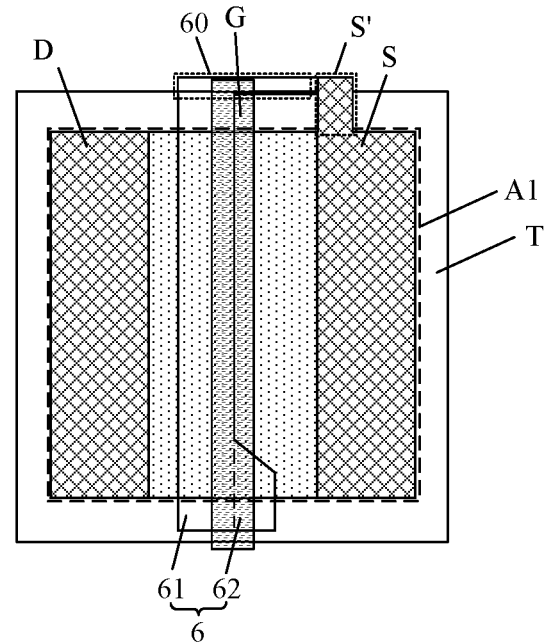
FIG. 4 is a schematic diagram of a structure of a transistor according to an embodiment of this application.

For example, as shown in FIG. 4, in some possible implementations, in an area (a non-active area) other than the active area A1, a first extension part 60 may be disposed from an end part (for example, an upper end) of the source field plate 6 to the side of the source S, a second extension part S' is disposed on an end part (an upper end) of the source S on a same side, and the first extension part 60 is disposed to connect to the second extension part S', to ensure an electrical connection between the source field plate 6 and the source S.

Based on this, to simplify a manufacturing process and reduce manufacturing costs, in some possible implementations, the foregoing primary field plate 61 and the foregoing secondary field plate 62 may be an integrated structure of a same layer and a same material. To be specific, the primary field plate 61 and the secondary field plate 62 can be obtained by patterning a same film layer (for example, including processes such as exposure, development, evaporation, and stripping).

Figure 5:
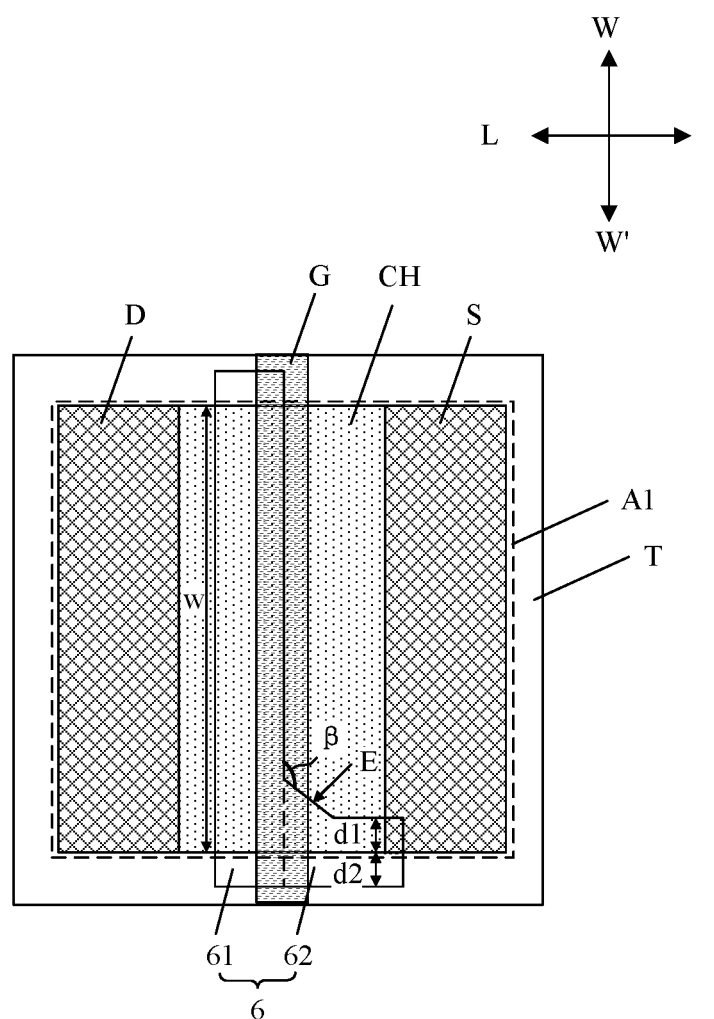
FIG. 5 is a schematic diagram of a structure of a transistor according to an embodiment of this application.

In addition, refer to FIG. 5. In some possible implementations, to avoid impacting the performance of the component caused by an excessively large parasitic capacitance Cgs introduced between the source field plate 6 and the gate G when an electric field peak generated on a side of the gate G close to the source S is reduced by using the secondary field plate 62, a distance d1 of extending, by the secondary field plate 62, from a boundary line between the isolation area T and the channel CH to a side of the channel CH may be set to 1% to 5% of a width w of the channel, and a distance d2 of extending, by the secondary field plate 62, from the boundary line between the isolation area T and the channel CH to a side of the isolation area T is 1% to 5% of the width w of the channel.

In other words, the extension distance d1 and the extension distance d2 are set to be greater than or equal to 1% of the width w of the channel, to ensure that the electric field peak generated on the side of the gate G close to the source S can be effectively reduced by using the secondary field plate 62. The extension distance d1 and the extension distance d2 are less than or equal to 5% of the width w of the channel, to ensure that an excessively large parasitic capacitance Cgs is not introduced between the source field plate 6 and the gate G, and the performance of the component is not affected. Certainly, the extension distance d1 and the extension distance d2 may be same, or may be different. This is not limited in this application.

For example, in some possible implementations, the extension distance d1 and the extension distance d2 may be set to be the same or approximately the same. For example, both the extension distance d1 and the extension distance d2 may be set to 1%, 2.5%, 3%, 4.5%, or 5% of the width w of the channel.

In addition, in this application, a distance that the secondary field plate 62 extends from the primary field plate 61 to the side of the source S along the channel CH is not specifically limited.

For example, in some possible implementations, as shown in FIG. 4, the secondary field plate 62 may extend from an edge (namely, an edge close to the side of the source) of the primary field plate 61 to an area between the gate G and the source S. In other words, an edge of the secondary field plate 62 protrudes from an edge of the gate G, but does not overlap the source S.

For another example, in some possible implementations, as shown in FIG. 5, the secondary field plate 62 may extend from an edge (namely, an edge close to the side of the source) of the primary field plate 61 to connect to the source S (in a short-connection manner).

It should be noted herein that, in a case in which the source field plate 6 is connected to the source S by using the secondary field plate 62, no extension part (for example, the foregoing extension parts 60 and S') may be separately disposed to connect the source field plate 6 to the source S.

Figures 6, 7:
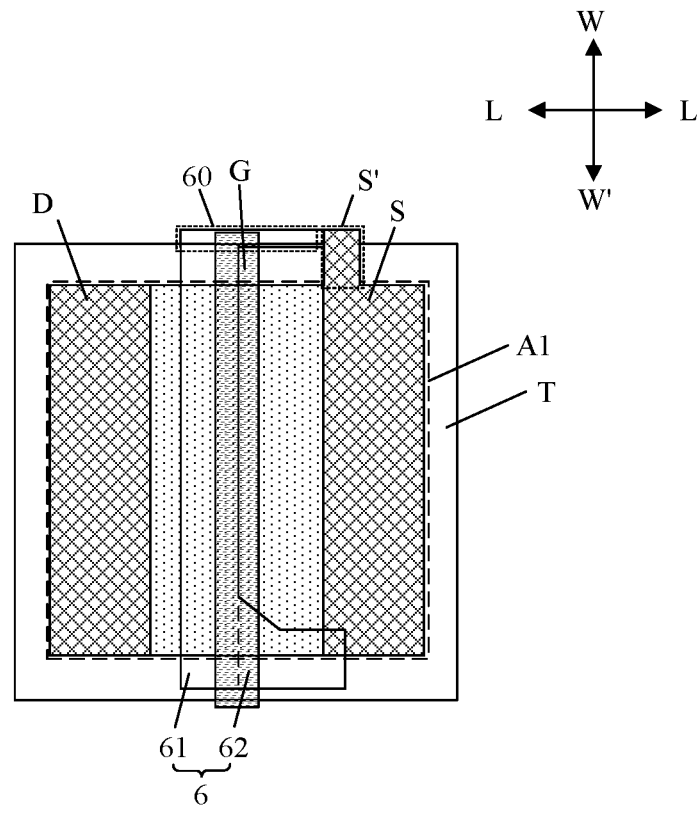
FIG. 6 is a schematic diagram of a structure of a transistor according to an embodiment of this application.
FIG. 7 is a schematic diagram of a structure of a transistor according to an embodiment of this application.

Refer to FIG. 6. Certainly, in some possible implementations, especially for a transistor with a large gate width (namely, a distance of the gate in the WW' direction), the transistor may be disposed along a width direction (namely, the WW' direction) of the channel. One end of the source field plate 6 extends by using the secondary field plate 62 to connect to the source S, and the other end is connected to the second extension part S' by using the first extension part 60, that is, both ends of the source field plate 6 are connected to the source S.

It may be understood herein that, when a wavelength and the gate width (namely, the distance of the gate in the WW' direction) of a radio frequency signal loaded on the gate and the source are comparable, a phase difference problem of the radio frequency signal occurs in a direction of the gate width. However, in the foregoing in which both ends of the source field plate 6 are respectively connected to the source S shown in FIG. 6, both ends of the source field plate 6 may be connected to the source S in the short-connection manner, so that the phase difference problem of the radio frequency signal can be alleviated.

In addition, in some possible implementations, as shown in FIG. 5, an included angle β greater than 90 degrees may be set between a part of the secondary field plate 62 located in the channel CH and the primary field plate 61, preventing an electric field peak from being generated because a sharp included angle shape is formed at a joint E between the secondary field plate 62 and the primary field plate 61 located in the active area A1.

For example, in some possible implementations, the included angle β between the part of the secondary field plate 62 located in the channel CH and the primary field plate 61 may be within a range from 120° to 150°. For example, the included angle β may be 120°, 130°, or 150°.

Figure 8:
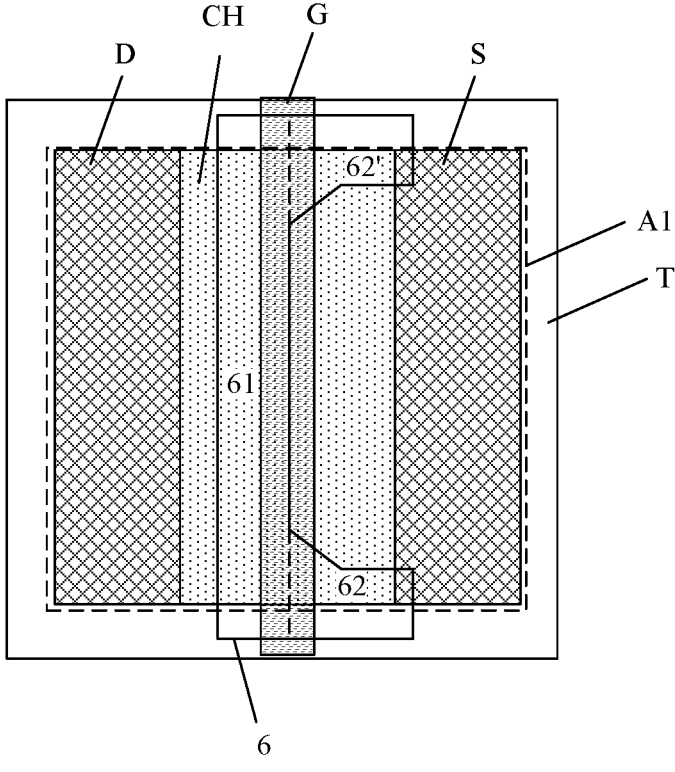
FIG. 8 is a schematic diagram of a structure of a transistor according to an embodiment of this application.

Refer to FIG. 7 and FIG. 8. In addition to reducing the probability of ESD breakdown occurring between the gate G and a two-dimensional electron gas (2DEG) in the channel CH in the boundary area between the channel CH and the isolation area T on both sides of the channel CH, in some possible implementations, the source field plate 6 may be set to include two secondary field plates (62 and 62'), and the two secondary field plates (62 and 62') respectively extend from side surfaces of the primary field plate 61 to the side of source S in the boundary area between the channel CH and the isolation area T on both sides of the channel CH. In this case, the electric field strength of the gate G in the boundary area between the channel CH and the isolation areas T on both sides of the channel CH can be dispersed by using the two secondary field plates, and an electric field peak generated by the gate G in the boundary area between the channel CH and the isolation areas T on both sides of the channel CH can be reduced, thereby further reducing the probability of ESD breakdown occurring between the gate G and the two-dimensional electron gas (2DEG) in the channel CH of the transistor, thereby improving the ESD capability of the component.

It should be noted that, in a case in which two secondary field plates (62 and 62') are disposed on the foregoing source field plate 6, in some possible implementations, the two secondary field plates (62 and 62') may be parts of a same structure. For example, in FIG. 7 and FIG. 8, the two secondary field plates (62 and 62') that are symmetrically disposed and that are of the same structure are used. In some possible implementations, the two secondary field plates (62 and 62') may alternatively be disposed in different structures. For example, a structure shown in FIG. 7 (to be specific, the edge of the secondary field plate 62 extending to the area between the gate G and the source S) may be used for the secondary field plate 62, and a structure shown in FIG. 8 (where an edge of the secondary field plate 62' extends to connect to the source S) may be used for the secondary field plate 62'. This is not limited in this application, and may be set based on a requirement in practice.

In addition, it may be further understood that, compared with a configuration in which the edges of the two secondary field plates (62 and 62') extend to the area between the gate G and the source S in FIG. 7, the edges of the secondary field plates (62 and 62') extend to connect to the source S in FIG. 8, so that both ends of the source field plate 6 are connected to the source S in the short-connection manner, so that the phase difference problem of the radio frequency signal can be alleviated.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A transistor, comprising:
a source, a drain, a gate, a channel and first and second isolation areas disposed on opposite sides of the channel, wherein the channel defines a plane and defines within the plane a transverse axis extending from the source to the drain and a longitudinal axis, perpendicular to the transverse axis, extending from the first isolation area to the second isolation area; and
a source field plate, comprising a primary field plate and a secondary field plate, electrically connected to the source, and disposed such that the gate is between the source field plate and the channel;
wherein the primary field plate comprises a rectangle having sides parallel to the transverse and longitudinal axes, wherein the rectangle is wider than the channel in a direction of the longitudinal axis such that the rectangle extends into both the first and second isolation areas, wherein a first edge of the rectangle, parallel to the longitudinal axis, aligns with a center line of the gate and a second edge of the rectangle, also parallel to the longitudinal axis, is disposed between the drain and the gate; and
wherein the secondary field plate defines a trapezoid having a first edge adjoining the first edge of the rectangle, a second edge parallel to and shorter than the first edge, and a third edge disposed within the first isolation area and that is colinear with an edge of the rectangle that is parallel to the transverse axis.

2. The transistor according to claim 1, further comprising a buffer layer and a barrier layer, wherein the channel is located at a boundary between the buffer layer and the barrier layer.

3. The transistor according to claim 1, wherein
the secondary field plate extends from the primary field plate to an area between the gate and the source along the channel.

4. The transistor according to claim 1, wherein
the secondary field plate extends from the primary field plate along the channel to connect to the source.

5. The transistor according to claim 1, wherein
the source field plate further comprises a tertiary field plate that also defines a trapezoid having a first edge adjoining the first edge of the rectangle, a second edge parallel to and shorter than the first edge, and a third edge disposed within the second isolation area and that is colinear with another edge of the rectangle that is also parallel to the transverse axis.

6. The transistor according to claim 1, wherein
the second edge of the trapezoid crosses a boundary between the first isolation area and the channel, and a length of the second edge of the trapezoid from the boundary to a vertex with a fourth edge of the trapezoid is 1% to 5% of a width of the channel measured in the direction of the longitudinal axis, and a length of the second edge of the trapezoid from the boundary to a vertex with the third edge of the trapezoid is 1% to 5% of the width of the channel.

7. The transistor according to claim 1, wherein the primary field plate and the secondary field plate are integral and of a same material.

8. The transistor according to claim 1, wherein the gate comprises a T-type gate structure.

9. An electronic component, comprising:
a source, a drain, a gate, a channel and first and second isolation areas disposed on opposite sides of the channel, wherein the channel defines a plane and defines within the plane a transverse axis extending from the source to the drain and a longitudinal axis, perpendicular to the transverse axis, extending from the first isolation area to the second isolation area; and
a source field plate, comprising a primary field plate and a secondary field plate, electrically connected to the source, and disposed such that the gate is between the source field plate and the channel;
wherein the primary field plate comprises a rectangle having sides parallel to the transverse and longitudinal axes, wherein the rectangle is wider than the channel in a direction of the longitudinal axis such that the rectangle extends into both the first and second isolation areas, wherein a first edge of the rectangle, parallel to the longitudinal axis, aligns with a center line of the gate and a second edge of the rectangle, also parallel to the longitudinal axis, is disposed between the drain and the gate; and
wherein the secondary field plate defines a trapezoid having a first edge adjoining the first edge of the rectangle, a second edge parallel to and shorter than the first edge, and a third edge disposed within the first isolation area and that is colinear with an edge of the rectangle that is parallel to the transverse axis.

10. A terminal device, comprising:
a source, a drain, a gate, a channel and first and second isolation areas disposed on opposite sides of the channel, wherein the channel defines a plane and defines within the plane a transverse axis extending from the source to the drain and a longitudinal axis, perpendicular to the transverse axis, extending from the first isolation area to the second isolation area; and a source field plate, comprising a primary field plate and a secondary field plate, electrically connected to the source, and disposed such that the gate is between the source field plate and the channel;

wherein the primary field plate comprises a rectangle having sides parallel to the transverse and longitudinal axes, wherein the rectangle is wider than the channel in a direction of the longitudinal axis such that the rectangle extends into both the first and second isolation areas, wherein a first edge of the rectangle, parallel to the longitudinal axis, aligns with a center line of the gate and a second edge of the rectangle, also parallel to the longitudinal axis, is disposed between the drain and the gate; and wherein the secondary field plate defines a trapezoid having a first edge adjoining the first edge of the rectangle, a second edge parallel to and shorter than the first edge, and a third edge disposed within the first isolation area and that is colinear with an edge of the rectangle that is parallel to the transverse axis.

11. The electronic component of claim 9, further comprising a buffer layer and a barrier layer, wherein the channel is located at a boundary between the buffer layer and the barrier layer.

12. The electronic component of claim 9, wherein the secondary field plate extends from the primary field plate to an area between the gate and the source along the channel.

13. The electronic component of claim 9, wherein the secondary field plate extends from the primary field plate along the channel to connect to the source.

14. The electronic component of claim 9, wherein the source field plate further comprises a tertiary field plate that also defines a trapezoid having a first edge adjoining the first edge of the rectangle, a second edge parallel to and shorter than the first edge, and a third edge disposed within the second isolation area and that is colinear with another edge of the rectangle that is also parallel to the transverse axis.

15. The terminal device of claim 10, further comprising a buffer layer and a barrier layer, wherein the channel is located at a boundary between the buffer layer and the barrier layer.

16. The terminal device of claim 10, wherein the secondary field plate extends from the primary field plate to an area between the gate and the source along the channel.

17. The terminal device of claim 10, wherein the secondary field plate extends from the primary field plate along the channel to connect to the source.

18. The terminal device of claim 10, wherein the source field plate further comprises a tertiary field plate that also defines a trapezoid having a first edge adjoining the first edge of the rectangle, a second edge parallel to and shorter than the first edge, and a third edge disposed within the second isolation area and that is colinear with another edge of the rectangle that is also parallel to the transverse axis.

19. The transistor according to claim 1, wherein the source field plate further comprises a tertiary field plate defining a second rectangle having a first edge coextensive with the second edge of the trapezoid and a second edge colinear with the third edge of the trapezoid.

20. The electronic component of claim 9, wherein the source field plate further comprises a tertiary field plate that also defines a trapezoid having a first edge adjoining the first edge of the rectangle, a second edge parallel to and shorter than the first edge, and a third edge disposed within the second isolation area and that is colinear with another edge of the rectangle that is also parallel to the transverse axis.

* * * * *